United States Patent
Kononchuk et al.

(10) Patent No.: US 9,759,546 B2
(45) Date of Patent: Sep. 12, 2017

(54) METHOD FOR MEASURING THICKNESS VARIATIONS IN A LAYER OF A MULTILAYER SEMICONDUCTOR STRUCTURE

(71) Applicants: SOITEC, Bernin (FR); STMICROELECTRONICS (CROLLES 2) SAS, Crolles (FR)

(72) Inventors: Oleg Kononchuk, Grenoble (FR); Didier Dutartre, Meylan (FR)

(73) Assignees: Soitec, Bernin (FR); STMICROELECTRONICS (Crolles 2) SAS, Crolles (FR)

( * ) Notice: Subject to any disclaimer, the term of this patent is extended or adjusted under 35 U.S.C. 154(b) by 132 days.

(21) Appl. No.: 14/442,081

(22) PCT Filed: Sep. 19, 2013

(86) PCT No.: PCT/EP2013/069528
§ 371 (c)(1),
(2) Date: May 11, 2015

(87) PCT Pub. No.: WO2014/072109
PCT Pub. Date: May 15, 2014

(65) Prior Publication Data
US 2015/0300809 A1    Oct. 22, 2015

(30) Foreign Application Priority Data
Nov. 12, 2012 (FR) ..................... 12 60751

(51) Int. Cl.
*G01B 11/28* (2006.01)
*G01B 11/06* (2006.01)
(Continued)

(52) U.S. Cl.
CPC .......... *G01B 11/06* (2013.01); *G01B 11/0633* (2013.01); *G01B 11/30* (2013.01); *G02B 21/361* (2013.01); *H01L 22/12* (2013.01)

(58) Field of Classification Search
CPC ..... G01B 11/06–11/0683; G01B 11/30; H01L 22/12; G02B 21/361
See application file for complete search history.

(56) References Cited

U.S. PATENT DOCUMENTS

| 5,402,001 A | 3/1995 | Hagi |
| 2002/0057437 A1 | 5/2002 | McMillen |

FOREIGN PATENT DOCUMENTS

| CN | 1630940 A | 6/2005 |
| CN | 1732372 A | 2/2006 |

(Continued)

OTHER PUBLICATIONS

International Search Report for International Patent Application PCT/EP2013/069528, dated Oct. 4, 2013.
(Continued)

*Primary Examiner* — Kara E Geisel
*Assistant Examiner* — Rufus Phillips
(74) *Attorney, Agent, or Firm* — TraskBritt

(57) ABSTRACT

The invention relates to a method for measuring thickness variations in a layer of a multilayer semiconductor structure, characterized in that it comprises: acquiring, via an image acquisition system, at least one image of the surface of the structure, the image being obtained by reflecting an almost monochromatic light flux from the surface of the structure; and processing the at least one acquired image in order to determine, from variations in the intensity of the light reflected from the surface, variations in the thickness of the layer to be measured, and in that the wavelength of the almost monochromatic light flux is chosen to correspond to a minimum of the sensitivity of the reflectivity of a layer of the structure other than the layer the thickness variations of which must be measured, the sensitivity of the reflectivity of a layer being equal to the ratio of: the difference between the reflectivities of two multilayer structures for which the layer (Continued)

in question has a given thickness difference; to the given thickness difference, the thicknesses of the other layers being for their part identical in the two multilayer structures. The invention also relates to a measuring system implementing the method.

16 Claims, 4 Drawing Sheets

(51) Int. Cl.
  *G01B 11/30* (2006.01)
  *H01L 21/66* (2006.01)
  *G02B 21/36* (2006.01)

(56) References Cited

FOREIGN PATENT DOCUMENTS

EP        2426717  A1    3/2012
JP      2002197730  A    7/2002

OTHER PUBLICATIONS

Chinese First Office Action for Chinese Application No. 2013/80056335, 9 dated Oct. 31, 2016, 8 pages.
International Written Opinion for International Application No. PCT/EP2013/069528 dated Oct. 4, 2013, 12 pages.
Chinese First Search for Chinese Application No. 2013180056335.9 dated Oct. 23, 2016, 1 page.

METHOD FOR MEASURING THICKNESS VARIATIONS IN A LAYER OF A MULTILAYER SEMICONDUCTOR STRUCTURE

CROSS-REFERENCE TO RELATED APPLICATIONS

This application is a national phase entry under 35 U.S.C. §371 of International Patent Application PCT/EP2013/069528, filed Sep. 19, 2013, designating the United States of America and published in English as International Patent Publication WO 2014/072109 A1 on May 15, 2014, which claims the benefit under Article 8 of the Patent Cooperation Treaty to France Application Serial No. 1260751, filed Nov. 12, 2012, the disclosure of each of which is hereby incorporated herein in its entirety by this reference.

TECHNICAL FIELD

The present invention relates to a method for measuring thickness variations in a layer of a multilayer semiconductor layer, as well as to a system allowing application of the method.

BACKGROUND

In the field of electronics, multilayer semiconductor structures are frequently used.

A particular example of such structures is a structure of the semiconductor-on-insulator (SeOI) type.

A structure of the SeOI type typically comprises from its base to its surface a supporting substrate, an electrically insulating layer and a thin semiconducting layer, called an active layer, in or on which electronic components are generally intended to be formed.

When the thin layer is silicon, the structure is designated by the term of SOL an acronym of "Silicon On Insulator."

The electrically insulating layer is a dielectric material, notably an oxide of the material of the supporting substrate and/or of the thin layer. This layer is then usually designated by the term of BOX, acronym of "Buried Oxide."

Recently, SOI structures having an extra-thin layer of silicon have been developed.

These structures are designated by the term of "FDSOI," for "Fully Depleted SOI," i.e., a totally depleted SOT.

By "ultra-thin" is meant a thickness of less than or equal to 50 nm, preferably less than or equal to 12 nm, which may even be reduced down to about 5 nm.

FDSOI structures are particularly advantageous for producing planar electronic components, for example, FDMOS (acronym of "Fully Depleted Metal Oxide Semiconductor") transistors, for which the channel is formed in or on the thin layer of silicon.

Because of the extreme thinness of the thickness of the thin layer, the threshold voltage of the transistor (usually noted as Vt), which depends on this thickness, is very sensitive to thickness variations of the thin layer.

For such applications, optimum uniformity of the thin silicon layer is, therefore, sought so as to have minimum Vt variability from one transistor to the other.

Considering the small dimensions of these devices and their great proximity, it is necessary to measure the thickness variation between points very close to each other, for example, every 0.5 µm.

This involves, during the method for making the SOI, measuring the thickness of the thin silicon layer and of the electrically insulating layer, in different points of the surface of the SOI, in a wide range of spatial wavelengths, typically comprised between 0.5 µm and 300 mm.

Present measurement methods are based on optical measurements, notably ellipsometry or spectral reflectometry.

In both cases, these methods involve conducting a large number of measurements by illuminating the SOI with a light flux having several optical wavelengths, so as to not only measure the thickness of the silicon layer but also that of the buried oxide layer.

However, with these techniques, it is not possible to conduct measurements with spatial wavelengths as small as 0.5 µm.

Thus, an ellipsometer allows measurements to be conducted with spatial wavelengths greater than or equal to about 40 µm.

On the other hand, these measurements take a long time and slow the manufacturing cycle of the SOIs.

Moreover, measurements conducted by ellipsometry or reflectometry with a single optical wavelength would not give the possibility of determining with sufficient accuracy the thickness of the silicon layer, since, for a given optical wavelength, the measured thickness of the silicon layer depends on the thickness and on the nature of the underlying buried oxide layer.

An object of the invention is, therefore, to propose a method for measuring thickness variations in a layer of a multilayer semiconductor structure, which gives the possibility of conducting measurements in particular in the range of spatial wavelengths comprised between 0.5 and 40 µm, which is not accessible with the present measurement methods.

In particular, the method should allow measurements of thickness variations in the thin silicon layer of an FDSOI structure, with an accuracy at least equal to 0.1 nm.

BRIEF SUMMARY

According to the invention, a method is proposed for measuring thickness variations in a layer of a multilayer semiconductor structure, which comprises:
  acquiring, with at least an image acquisition system, at least one image of the surface of the structure, the image being obtained by reflecting a quasi-monochromatic light flux on the surface of the structure,
  processing the at least one acquired image so as to determine, from intensity variations of the light reflected by the surface, the variations of the thickness of the layer to be measured,
  the wavelength of the quasi-monochromatic light flux being selected so as to correspond to a minimum of the sensitivity of the reflectivity of the multilayer structure with respect to a layer of the structure other than the layer for which thickness variations have to be measured.

The sensitivity of the reflectivity with respect to a layer of the structure, which is analogous to the reciprocal of a length, is defined as being the ratio between:
  the difference between the reflectivities of two multilayer structures for which the considered layer has a given thickness difference from one structure to the other (for example, 0.1 nm) and
  the given thickness difference,
  the thicknesses of the other layers being identical in both structures.

In other words, both structures targeted above consist of the same layers, the layers having the same thickness in both structures except for the layer for which the sensitivity of the reflectivity is to be measured and to which is assigned a thickness which differs from one structure to the other.

This sensitivity of the reflectivity depends on the wavelength of the light flux used for the measurement.

For the application of the invention, the absolute value of the sensitivity is of interest, the minimum sought sensitivity relative to a layer other than the layer to be measured being zero or close to 0.

By a "multilayer structure," is meant a structure comprising at least two layers which are transparent at the wavelength of the quasi-monochromatic measurement flux.

By "quasi-monochromatic" is meant a light flux for which the spectrum extends in a range of wavelengths which may extend up to +/−20 nm relatively to a rated wavelength. When the wavelength of the quasi-monochromatic flux is referred to, reference is made to the rated wavelength. Naturally, a monochromatic light flux, i.e., having a single wavelength, may also be used for applying the invention.

According to an embodiment of the invention, the image acquisition system is an optical microscope.

According to another embodiment, the image acquisition system is a digital photo camera for which the size of a pixel is less than or equal to 0.25 µm.

Preferably, the numerical aperture of the image acquisition system is greater than or equal to 0.8.

The incidence of the light flux on the surface of the structure is advantageously normal to the surface.

According to an embodiment, the treatment comprises a calculation of a theoretical reflectivity of the multilayer structure depending on the thickness of the layer to be measured for the wavelength of the quasi-monochromatic light flux and the determination, from this calculation, of a mapping of the thickness variations of the layer.

According to an embodiment, the treatment comprises:
  comparing the image with a calibration curve established beforehand, the calibration curve providing a relationship between the grey levels of the acquired image and a local thickness of the layer to be measured, and
  determining, from the calibration curve, a mapping of the thickness variations of the layer on the surface of the structure.

Advantageously, the method comprises, prior to the acquisition of the at least one image, the following steps:
  measuring the thickness of each of the layers of the structure,
  from the measured thickness, simulating the sensitivity of the reflectivity relatively to each of the layers depending on the wavelength of an incident light flux, and
  determining, from the simulation, the wavelength of the quasi-monochromatic light flux intended to illuminate the surface of the structure, the wavelength being selected so as to minimize the sensitivity of the reflectivity with respect to a layer other than the layer to be measured.

The thickness measurement is advantageously conducted by means of an ellipsometer or reflectometer.

According to a particular application of the invention, the multilayer structure is a structure consisting of two layers transparent to the wavelength of the quasi-monochromatic light flux on a supporting substrate.

In a particularly advantageous way, the multilayer structure is a semiconductor-on-insulator structure comprising a supporting substrate, an electrically insulating layer and a semiconductor layer and the layer for which the thickness variations are measured is the semiconductor layer.

For example, the structure is advantageously an FDSOI structure, the layer for which the thickness variations are measured being a silicon layer having a thickness of less than or equal to 50 nm, preferably less than or equal to 12 nm.

Another object relates to a measurement system allowing the application of the method described above.

The system for measuring thickness variations in a layer of a multilayer semiconductor structure comprises:
  a device for illuminating the structure, adapted for emitting a quasi-monochromatic light flux towards the surface of the structure,
  a device for selecting the wavelength of the quasi-monochromatic light flux, configured for determining a wavelength corresponding to a minimum of the sensitivity of the reflectivity relatively to a layer of the structure other than the layer for which the thickness variations have to be measured, the sensitivity of the reflectivity relatively to a layer being equal to the ratio between:
    the difference between the reflectivities of two multilayer structures for which the considered layer has a given thickness difference, and
    the given thickness difference,
    the thicknesses of the other layers being identical in both multilayer structures,
  the selection device being coupled with the illumination device in order to provide to the illumination device the determined wavelength of the light flux to be emitted,
    an image acquisition system laid out so as to acquire at least one image of the surface of the structure by reflection of the quasi-monochromatic light flux,
    a processing system configured for determining, from the at least one acquired image and from intensity variations of the light reflected by the surface, the thickness variations of the layer to be measured.

According to an embodiment, the illumination device comprises a source of white light and a wheel supporting a plurality of filters having different wavelengths, the wheel being adapted for rotating so that the light emitted by the source passes through a filter having the wavelength determined by the selection device before attaining the surface of the structure to be measured.

According to another embodiment, the illumination device comprises a plurality of light sources each having a different wavelength and a plurality of the removable obturators coupled with the sources and laid out so as to only let through the light having the wavelength determined by the selection device towards the surface of the structure to be measured.

BRIEF DESCRIPTION OF THE DRAWINGS

Other features and advantages of the invention will become apparent from the detailed description which follows, with reference to the accompanying drawings wherein.

DETAILED DESCRIPTION

Figure 1:
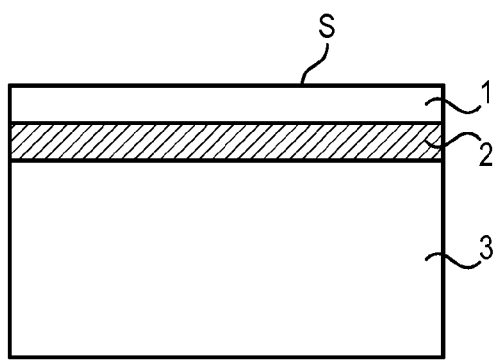
FIG. 1 is a sectional view of a multilayer structure, for which an attempt is made for measuring the thickness variations of one of the layers, FIG. 2 schematically illustrates the reflections occurring in two layers of a multilayer structure.

FIG. 1 illustrates a multilayer structure for which the thickness variations of one of the layers are to be measured.

The structure successively comprises from its surface S to its base a first layer 1, a second layer 2 and a supporting substrate 3.

The first and second layer are in selected materials so as to be transparent at the measurement wavelength, i.e., the incident light flux is able to cross each of the layers and be partly reflected on the surface of the underlying layer.

Generally, the semiconducting materials and the dielectric materials have this property, provided that they have a sufficiently thin thickness, i.e., typically less than 500 nm.

A very fine metal layer (i.e., having a thickness of less than 200 nm) may also be applied in such a multilayer structure.

The person skilled in the art is able to determine, for materials customarily used in the field of electronics, the maximum thicknesses for which they are transparent to a given wavelength.

The supporting substrate on the other hand plays a role of a mechanical support and is generally too thick (typically a few hundred μm) so as to be transparent to the measurement wavelength.

The supporting substrate may be bulk or else consists of a plurality of layers of different materials.

In the example illustrated in FIG. 1, the structure is, therefore, a bilayer structure, the supporting structure not being considered as a layer, the thickness variations of which may be measured.

Nevertheless, the invention is not limited to such a structure but may also apply to a structure comprising three layers transparent to the measurement wavelength, or even more.

According to an advantageous application of the invention, the structure is a structure of the semiconductor-on-insulator type, in which the supporting substrate is the substrate 3, the electrically insulating layer is the buried layer 2, and the semiconductor layer is the surface layer 1.

According to an embodiment, the layer for which thickness variations are measured is the surface semiconductor layer 1.

In the particular case of an FDSOI structure, the layer for which the thickness variations are measured is the surface layer 1, which is a silicon layer having a thickness of less than or equal to 50 nm, preferably less than or equal to 12 nm.

Figure 2:
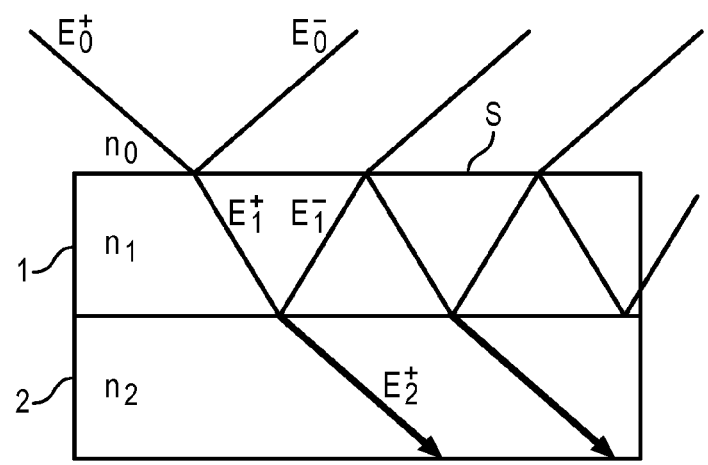

FIG. 2 schematically illustrates the reflections occurring in both layers of a multilayer structure (the supporting substrate is not shown).

An incident ray on the surface S is partly reflected on the surface and partly transmitted through the first layer 1.

This portion of the beam is in turn partly reflected at the interface between the layers 1 and 2, and partly transmitted through the second layer 2.

The layers 1 and 2 have different refractive indices, noted as n1 and n2, respectively.

It is possible to express in a matrix form the reflectivity of such a stack of the layers 1 and 2. The equation:

$$\begin{bmatrix} E_0^+ \\ E_0^- \end{bmatrix} = S \begin{bmatrix} E_{m+1}^+ \\ E_{m+1}^- \end{bmatrix}$$

wherein $E_0^+$ and $E_0^-$ are the components of the incident electric field and the reflected field on the layer 1, S is the diffusion matrix and $E_{m+1}^+$ and $E_{m+1}^-$ are the components of the incident electric field and reflected field on the layer m+1, m+1 being equal to the number of layers of the multilayer structure (the index 0 corresponding to the medium surrounding the structure), may be written as:

$$S = \begin{bmatrix} S_{11} & S_{12} \\ S_{21} & S_{22} \end{bmatrix} = \left( \prod_{v=1}^{m} I_{(v-1)v} L_v \right) \cdot I_{m(m+1)}$$

$$\text{wherein } L_j = \begin{bmatrix} e^{-i\xi_j d_j} & 0 \\ 0 & e^{i\xi_j d_j} \end{bmatrix}, I_{jk} = \frac{1}{t_{jk}} \begin{bmatrix} 1 & r_{jk} \\ r_{jk} & 1 \end{bmatrix}, \xi_j = \frac{2\pi}{\lambda} q_j,$$

$q_j = \tilde{n}_j \cos \phi_j = [\tilde{n}_j^2 - \tilde{n}_0^2 \sin \phi_0]^{1/2}$, j is an integer between 1 and m+1, $\Phi_0$ and $\Phi_j$, respectively, are the angle of incidence on the surface S of the multilayer structure and the reflection angle on the surface of the layer j.

The complex Fresnel reflection coefficients $r_{jk}$ and transmission coefficients $t_{jk}$ are defined by the following formulas:

for polarization s (perpendicular to the plane of incidence):

$$r_{jk} = \frac{q_j - q_k}{q_j + q_k} \text{ and } t_{jk} = \frac{2q_j}{q_j + q_k}$$

for polarization p (in the plane of incidence):

$$r_{jk} = \frac{\tilde{n}_k^2 q_j - \tilde{n}_j^2 q_k}{\tilde{n}_k^2 q_j + \tilde{n}_j^2 q_k} \text{ and } t_{jk} = \frac{2\tilde{n}_j \tilde{n}_k q_j}{\tilde{n}_k^2 q_j + \tilde{n}_j^2 q_k}$$

These coefficients allow simulation of the reflectivity of the stack of the layers 1 and 2 for a given illumination condition.

The reflectivity of the stack of the layers 1 and 2 depends on several parameters: the thickness of each of the layers, the polarization of the incident light flux, the angle of incidence and the wavelength of the light flux.

For a structure having layers 1 and 2 of different thicknesses, the inventors defined a quantity, called sensitivity of the reflectivity, representative of the influence on the reflectivity of the structure, of the thickness variations of each of the layers.

The sensitivity of the reflectivity relative to a layer of the multilayer structure is defined as being the ratio between:

the difference between the reflectivities of two multilayer structures for which the considered layer has a given thickness difference from one structure to the other, the thicknesses of the other layers as for them being identical in both structures, and the thickness difference.

The thickness difference is selected according to the accuracy level of the measurement which is to be conducted; the smaller this thickness difference, the more it is possible to accurately determine the optimum measurement wavelength.

As an indication, a thickness difference of 0.1 nm may be selected.

In other words, the sensitivity of the reflectivity relative to a layer corresponds to the partial derivative of the reflectivity curve relative to the thickness of the considered layer, the outer layers of the structure having a fixed thickness.

For example, for a structure of the SOI type as illustrated in FIG. 1, the sensitivity of the reflectivity is calculated with respect to the semiconductor layer 1 by setting the thickness of the buried oxide layer 2 and by determining the reflectivity of the structure for two different thicknesses of the semiconductor layer 1, the difference between both of these thicknesses, for example, being 0.1 nm.

For the same structure, the sensitivity of the reflectivity is defined relative to the buried oxide layer 2 by setting the thickness of the semiconductor layer 1 and by determining the reflectivity of the structure for two different thicknesses of the buried oxide layer 2, the difference between both of these thicknesses, for example, being 0.1 nm.

In the case of a stack of three layers transparent to the measurement wavelength, the person skilled in the art is able to determine on this same principle the Fresnel coefficients.

Notably, in the case when the structure comprises a surface layer, the thickness variations of which are to be determined, and two underlying transparent layers, it is possible to assimilate both of these layers to a single layer having a reflectivity and sensitivity which may be calculated from those of the two layers.

Figure 3:
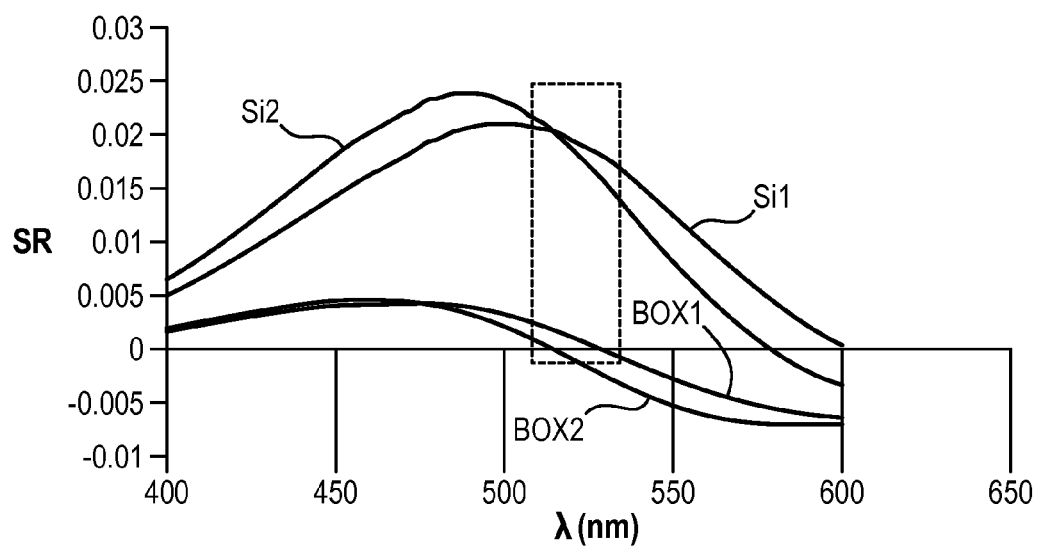
FIG. 3 shows the curves of the sensitivity of the reflectivity of an FDSOI structure, versus the wavelength, relatively to the thin silicon layer (curves Si1 and Si2) and relatively to the buried oxide layer (curves BOX1 and BOX2)

FIG. 3 illustrates the curves of the sensitivity of the reflectivity (noted as SR, expressed in $Å^{-1}$) of an FDSOI structure versus the wavelength $\lambda$ with non-polarized light calculated relatively to the silicon layer (curves Si1 and Si2) and relatively to the buried oxide layer (curves BOX1 and BOX2), for a thickness variation of the considered layer of 0.1 nm.

In this structure, the silicon layer has a thickness of about 12 nm and the buried oxide layer has a thickness of about 25 nm.

The rectangle in dotted lines appearing on this graph indicates an optimum range of wavelengths for illuminating the structure and for acquiring an image of the reflected light in order to determine the thickness variations in the silicon layer.

Indeed, in this interval, the sensitivity of the reflectivity with respect to the buried oxide layer is, in absolute value, a minimum (curves BOX1 and BOX2 passing through 0).

This means that the reflectivity variation measured with a quasi-monochromatic light flux in this range of wavelengths (being expressed, on an image of the surface, by intensity variations of the pixels) essentially depends on the thickness variations of the silicon curve to be measured.

It is, therefore, possible to determine, from intensity variations of the light reflected by the surface of the structure, the thickness variations of the layer to be measured.

In the illustrated example, the optimum wavelength of the light flux is between about 510 and 530 nm.

A quasi-monochromatic interferential filter around 515 nm may, therefore, be selected for forming the incident light flux.

Advantageously, the incident flux on the surface S of the structure is normal to the latter, this configuration simplifying subsequent processing of the image.

However it is possible, by way of additional processing within the competence of one skilled in the art, to make use of an image acquired by reflection of a light flux not normal to the surface of the structure.

For acquiring at least one image of the surface, various image acquisition systems may be used.

Preferably, the numerical aperture of the acquisition system is of at least 0.8.

According to an embodiment of the invention, the acquisition system comprises an optical microscope having a reflection mode, i.e., allowing illumination of the multilayer structure through its surface S to be observed.

The system further comprises a sensor able to acquire an image of the surface as seen by the microscope.

According to another embodiment of the invention, the acquisition system comprises a digital camera and allows direct acquisition of an image of the surface of the structure on which is reflected the incident light flux.

In order that the resolution of such a device is sufficient, it is considered that the size of the pixels should be less than or equal to 0.25 µm. In other words, a pixel of the device should correspond to a surface with a side of 0.25 µm or less on the surface of the structure.

The microscope and the camera give the possibility of obtaining spatial wavelengths up to 0.5 µm, which allows sufficiently fine determination of the thickness variations on the surface of the structure.

The images acquired by the acquisition system are typically black and white images having different grey levels.

The acquisition system is calibrated so as to have each grey level (intensity of each pixel) correspond with a corresponding thickness of the layer to be measured.

For this purpose, from several structures of a same nature, images of the surfaces of the structures are acquired by reflection of the quasi-monochromatic light flux and, on these same structures, a measurement by ellipsometry of the layer is conducted, for which the thickness variations are to be measured.

Figure 4:
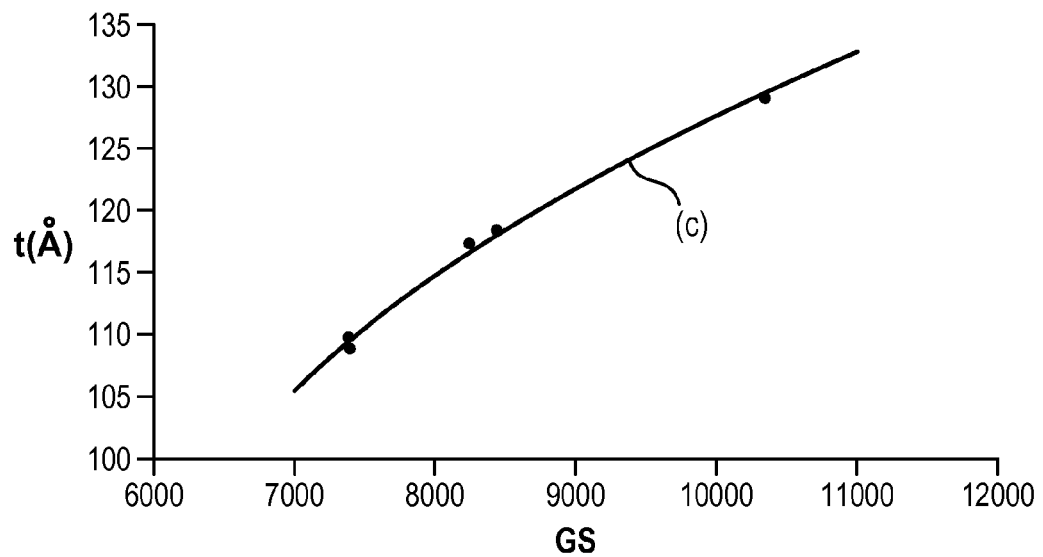
FIG. 4 shows a calibration curve of an optical microscope which may be applied in the invention.

A calibration curve of the type of the one illustrated in FIG. 4 is thereby obtained, which shows the thicknesses measured by ellipsometry versus the grey levels of the acquired image. In this figure, the grey levels correspond to an arbitrary scale.

In order to build the curve of FIG. 4, the thickness of the silicon layer of five (5) FDSOI structures, for which the silicon layer had a thickness between 11 and 13 nm, was measured by ellipsometry.

Moreover images of the surfaces of these structures were acquired with an incident quasi-monochromatic light flux of 540 nm and the intensity of the pixels of these images was measured.

It was, thus, possible to associate a determined thickness with the corresponding grey level on the image.

The measurement points were then used as a basis for defining a theoretical curve (c).

Once this calibration is carried out, it is possible to produce from the intensity of the different pixels of an image, a mapping of the thickness of the layer for which the thickness variations are to be measured.

Figure 5A:
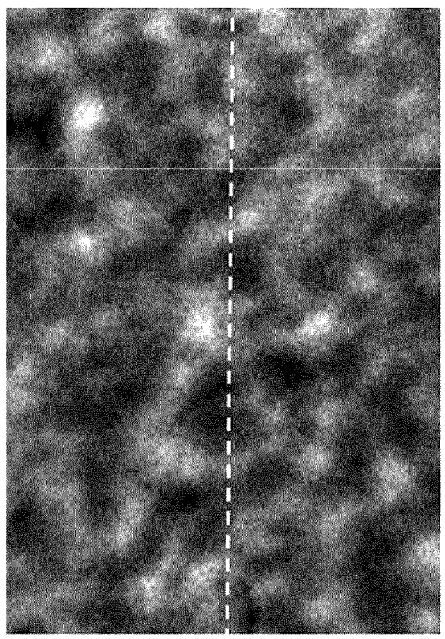
FIGS. 5A and 5B illustrate optical microscopy images acquired for two FDSOI structures and FIGS. 5C and 5D show thickness mappings of the thin silicon layer obtained for each of the structures, respectively.
Figure 5B:
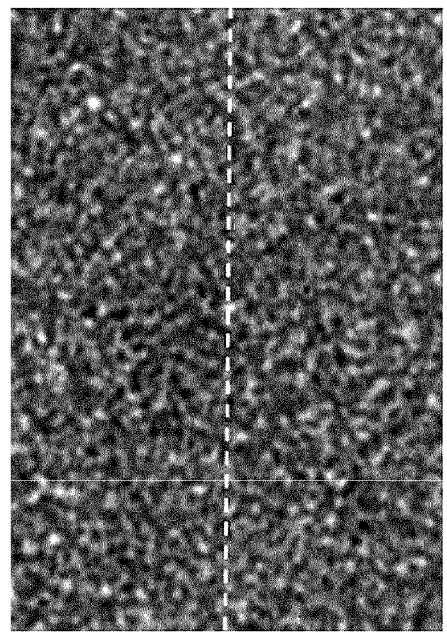

FIGS. 5A and 5B show two examples of images acquired by means of an Axiotron 2 optical microscope (commercially available from Carl Zeiss of Jena, Germany) in a reflection mode, comprising an objective having a numerical aperture of 0.9 and a magnification of 100 times.

Figure 5C:
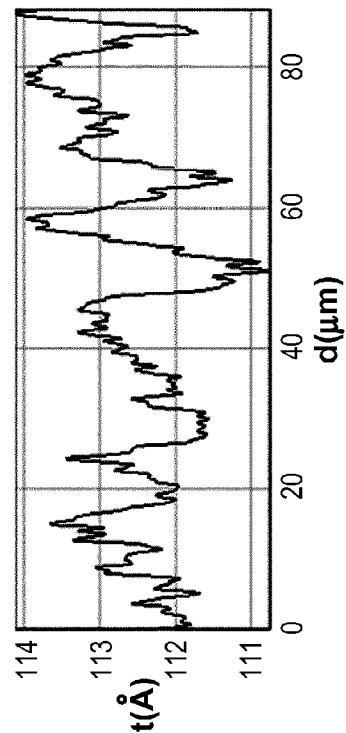
Figure 5D:
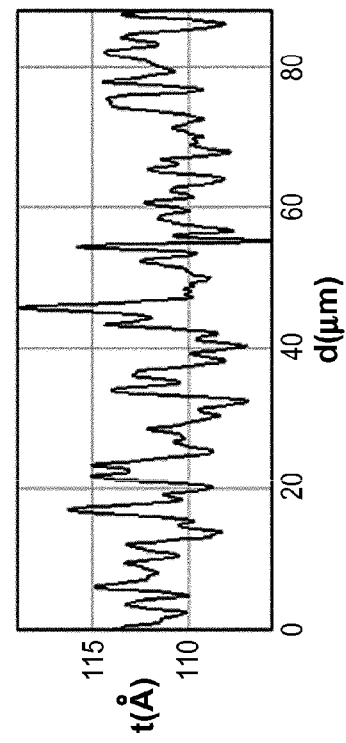

FIGS. 5C and 5D, respectively, show the variations of the thickness t (expressed in A (0.1 nm)) versus the distance d (expressed in μm) with respect to a reference point, in this case located on the left edge of the microscope image.

The measurement system for this purpose comprises a processing system configured so as to determine on an acquired image, from intensity variations of the light reflected by the surface, the variations of the thickness of the layer to be measured.

The processing system may, thus, comprise a computer provided with a microprocessor and a memory in which is recorded a program which may be executed by the microprocessor and containing instructions for applying the aforementioned computation steps.

The processing system may further comprise a screen for displaying a map of the thickness variations of the layer to be measured.

Moreover, the measurement system further comprises a device for selecting the wavelength of the quasi-monochromatic light flux, configured for determining a wavelength corresponding to a minimum of the sensitivity of the reflectivity with respect to a layer of the structure other than the layer for which the thickness variations have to be measured.

Advantageously, the processing system described above is itself configured in order to simulate the optical response of a multilayer structure and to automatically select the wavelength of the adequate quasi-monochromatic light flux.

For this purpose, the measurement system further comprises an ellipsometer or reflectometer, which is used for conventionally measuring the thickness of each of the layers of the structure from the reflectivity of the layers.

Alternatively or additionally, the measurement system comprises a graphic interface on which a user inputs the characteristics of the relevant structure (material and thickness of the different layers).

By knowing these thicknesses, the processing system applies a simulation of the sensitivity of the reflectivity relative to each of the layers of the structure depending on the wavelength of an illumination light flux and infers therefrom a range of wavelengths in which the sensitivity of the reflectivity with respect to the layer(s) of the structure other than the layer for which measurements of the thickness variations are to be obtained, is in absolute value, a minimum.

The selection device is then able to provide the thereby determined wavelength to an illumination device so that the latter illuminates the structure to be measured with a quasi-monochromatic light flux having the desired wavelength.

At least one image of the surface by reflection of the light flux is then acquired.

Figure 6:
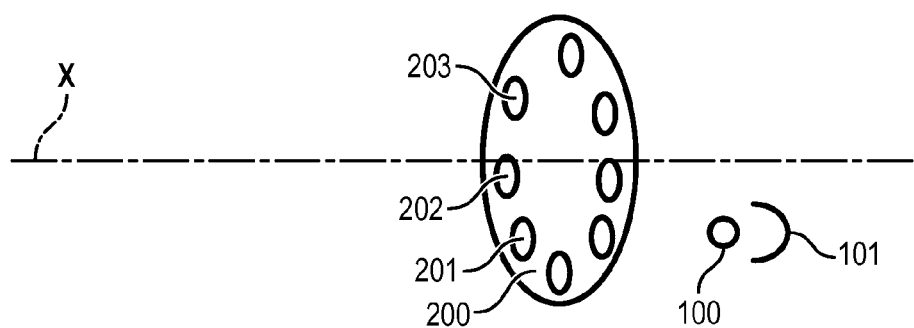
FIG. 6 illustrates an embodiment of an illumination device belonging to a measurement system, according to the invention.

FIG. 6 illustrates an embodiment of an illumination device which may be part of the measurement system, according to the invention.

The illumination device comprises a source 100 of white light associated with a reflector 101 and a wheel 200 supporting a plurality of filters 201, 202, 203, etc.

The wheel 200 is movable in rotation about an axis X so as to position, on the path of the light emitted by the source 100 and sent back by the reflector 101 towards the structure to be measured (not shown in this figure), the filter having the adequate wavelength for minimizing the sensitivity of the reflectivity with respect to a layer of the structure other than the structure for which the thickness variations have to be measured.

In this respect, the illumination device is coupled with the device for selecting the wavelength in order to impose a rotation of the wheel 200 depending on the selected wavelength.

Figure 7:
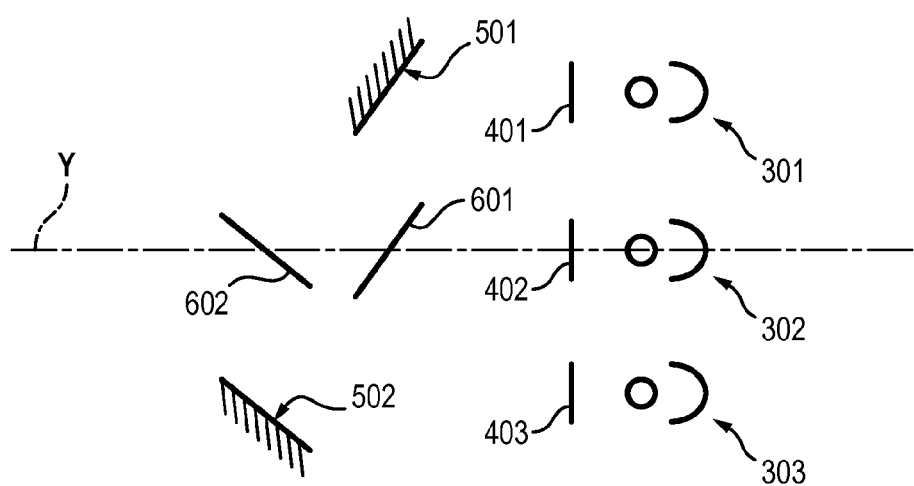
FIG. 7 illustrates another embodiment of an illumination device belonging to a measurement system, according to the invention.

FIG. 7 illustrates another embodiment of the illumination device.

In the latter, the illumination device comprises a plurality of light sources 301, 302, 303 (the number of sources is not limiting), each source having a different wavelength.

Each source is coupled with a removable obturator 401, 402, 403.

In the obturation position, each obturator is interposed on the path of the light emitted by each source so as to prevent transmission of light towards the structure to be measured.

The illumination device is moreover coupled with the wavelength selection device in order to displace one of the obturators depending on the selected wavelength, so as to allow illumination of the structure to be measured by the corresponding light source.

The illumination device further comprises, between the structure to be measured and the whole of the sources, an optical device comprising two mirrors 501, 502 and two semi-reflective plates 601, 602.

The semi-reflective plates 601, 602 are laid out symmetrically to each other on the optical axis Y.

The mirrors 501, 502 are laid out parallel to a respective semi-reflective plate at a distance from the optical axis Y.

Each semi-reflective plate lets through half of the incident light.

Thus, if the obturator 401 is open, the light emitted by the source 301 is reflected by the mirror 501 and is then half-transmitted through the plate 601 and half-reflected by the semi-reflective plate 601, this second half passing through the semi-reflective plate 602.

Optionally, alternatives or combinations of these embodiments are possible, for example, by using a plurality of light sources each associated with a filter-holding wheel.

Finally, it is obvious that the examples, which have just been given, are only particular and by no means limiting illustrations as to the fields of application of the invention. Notably, if the invention advantageously applies to the measurement of thickness variations of a structure of the FDSOI type, it is not limited to such a structure but to any multilayer structure comprising at least two layers transparent to the quasi-monochromatic light flux used for the measurement.

The invention claimed is:

1. A method for measuring thickness variations in a layer of a multilayer semiconductor structure, comprising:
    acquiring, with an image acquisition system, at least one image of the surface of the structure, the image being obtained by reflecting a quasi-monochromatic light flux on the surface of the structure;
    processing the at least one acquired image so as to determine, from the intensity variations of the light reflected by the surface, the thickness variations of the layer to be measured;
    wherein the wavelength of the quasi-monochromatic light flux is selected so as to correspond to a minimum of a sensitivity of the reflectivity with respect to another layer of the structure other than the layer for which the thickness variations are measured, the sensitivity of the reflectivity with respect to the another layer being equal to the ratio between:

the difference between the reflectivities of two multilayer structures for which the another layer has a given thickness difference; and the given thickness difference;

the thicknesses of the other layers being identical in the two multilayer structures.

2. The method of claim 1, wherein the image acquisition system is an optical microscope.

3. The method of claim 1, wherein the image acquisition system is a digital camera in which the size of a pixel is less than or equal to 0.25 µm.

4. The method of claim 1, wherein a numerical aperture of the image acquisition system is greater than or equal to 0.8.

5. The method of claim 1, wherein the incidence of the light flux on the surface of the structure is normal to the surface.

6. The method of claim 1, wherein the processing comprises a computation of a theoretical reflectivity of the multilayer semiconductor structure depending on the thickness of the layer to be measured for the wavelength of the quasi-monochromatic light flux and the determination, from the computation, of a mapping of the thickness variations of the layer.

7. The method of claim 1, wherein the processing comprises:

comparing the image with a calibration curve established beforehand, the calibration curve providing a relationship between grey levels of the acquired image and a local thickness of the layer to be measured; and determining, from the calibration curve, a mapping of the thickness variations of the layer on the surface of the structure.

8. The method of claim 1, further comprising, before acquiring the at least one image, the following steps:

measuring the thickness of each of the layers of the multilayer semiconductor structure;

from the measured thickness, simulating the sensitivity of the reflectivity with respect to each of the layers versus the wavelength of an incident light flux; and determining, from the simulation, the wavelength of the quasi-monochromatic light flux intended to illuminate the surface of the structure, the wavelength being selected so as to minimize the sensitivity of the reflectivity with respect to a layer other than the layer to be measured.

9. The method of claim 8, wherein the thickness measurement is conducted by means of an ellipsometer or a reflectometer.

10. The method of claim 9, wherein the multilayer semiconductor structure is a structure comprising two layers transparent to the wavelength of the quasi-monochromatic light flux on a supporting substrate.

11. The method of claim 10, wherein the multilayer semiconductor structure is a semiconductor-on-insulator structure comprising a supporting substrate, an electrically insulating layer and a semiconducting layer and wherein the layer for which the thickness variations are measured is the semiconducting layer.

12. The method of claim 11, wherein the structure is an FDSOI structure, the layer for which the thickness variations are measured being a silicon layer having a thickness of less than or equal to 50 nm, preferably less than or equal to 12 nm.

13. The method of claim 2, wherein a numerical aperture of the image acquisition system is greater than or equal to 0.8.

14. The method of claim 3, wherein a numerical aperture of the image acquisition system is greater than or equal to 0.8.

15. The method of claim 1, wherein the multilayer semiconductor structure is a structure comprising two layers transparent to the wavelength of the quasi-monochromatic light flux on a supporting substrate.

16. The method of claim 15, wherein the multilayer semiconductor structure is a semiconductor-on-insulator structure comprising a supporting substrate, an electrically insulating layer and a semiconducting layer and wherein the layer for which the thickness variations are measured is the semiconducting layer.

* * * * *

UNITED STATES PATENT AND TRADEMARK OFFICE
CERTIFICATE OF CORRECTION

PATENT NO. : 9,759,546 B2  
APPLICATION NO. : 14/442081  
DATED : September 12, 2017  
INVENTOR(S) : Oleg Kononchuk and Didier Dutartre Page 1 of 1

It is certified that error appears in the above-identified patent and that said Letters Patent is hereby corrected as shown below:

In the Specification  
Column 1, Line 38, change "term of SOL an" to --term of SOI an--  
Column 1, Line 46, change "totally depleted SOT." to --totally depleted SOI.--

Signed and Sealed this  
Twenty-third Day of January, 2018

Joseph Matal  
*Performing the Functions and Duties of the*  
*Under Secretary of Commerce for Intellectual Property and*  
*Director of the United States Patent and Trademark Office*